(12) United States Patent
Chen et al.

(10) Patent No.: US 8,366,217 B1
(45) Date of Patent: Feb. 5, 2013

(54) INSTALLATION DEVICE FOR SLIDE ASSEMBLY

(75) Inventors: Ken-Ching Chen, Kaohsiung (TW);
Shih-Lung Huang, Kaohsiung (TW);
Chiang-Hsueh Fang, Kaohsiung (TW);
Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 13/355,602

(22) Filed: Jan. 23, 2012

(51) Int. Cl.
*A47B 95/00* (2006.01)

(52) U.S. Cl. ........................................................ 312/333

(58) Field of Classification Search .................. 312/333, 312/223.1, 319.1, 334.1, 334.4, 334.5, 334.7, 312/334.47; 361/725–727; 211/26
See application file for complete search history.

(56) References Cited

U.S. PATENT DOCUMENTS

| | | | |
|---|---|---|---|
| 4,331,369 A | 5/1982 | Lazar et al. | |
| 5,632,542 A | 5/1997 | Krivec | |
| 6,123,314 A | 9/2000 | Steele | |
| 6,209,979 B1 | 4/2001 | Fall et al. | |
| 6,588,866 B2 | 7/2003 | Cheng | |
| 6,601,933 B1 | 8/2003 | Greenwald | |
| 6,938,967 B2 | 9/2005 | Dubon et al. | |
| 6,948,691 B2 | 9/2005 | Brock et al. | |
| 7,481,504 B2 | 1/2009 | Chen et al. | |
| 7,604,307 B2 | 10/2009 | Greenwald et al. | |
| 7,661,778 B2 | 2/2010 | Yang et al. | |
| 7,871,139 B2 * | 1/2011 | Yu et al. | 312/333 |
| 2004/0108797 A1 | 6/2004 | Chen et al. | |
| 2009/0294621 A1 * | 12/2009 | Yu et al. | 248/429 |

* cited by examiner

*Primary Examiner* — Janet M Wilkens
*Assistant Examiner* — Mart K Kuhn
(74) *Attorney, Agent, or Firm* — Rosenberg, Klein & Lee

(57) ABSTRACT

An installation device for a slide assembly includes a first rail and a second rail which has a guide seat and two slots for being connected with an exterior equipment. A positioning member is fixed to the second rail and an arm board has a positioning hole located corresponding to one of the slots of the second rail so that one of installation members of the exterior equipment is engaged with the positioning hole. An end board has a through hole and an end piece extending toward the second rail. The release member is movably installed to the second rail. When the release member is moved by an exterior force and positioned by the guide seat, the protrusion of the release member pushes the end piece to keep the positioning hole away from the second rail and the exterior equipment is removed from the positioning hole.

6 Claims, 6 Drawing Sheets

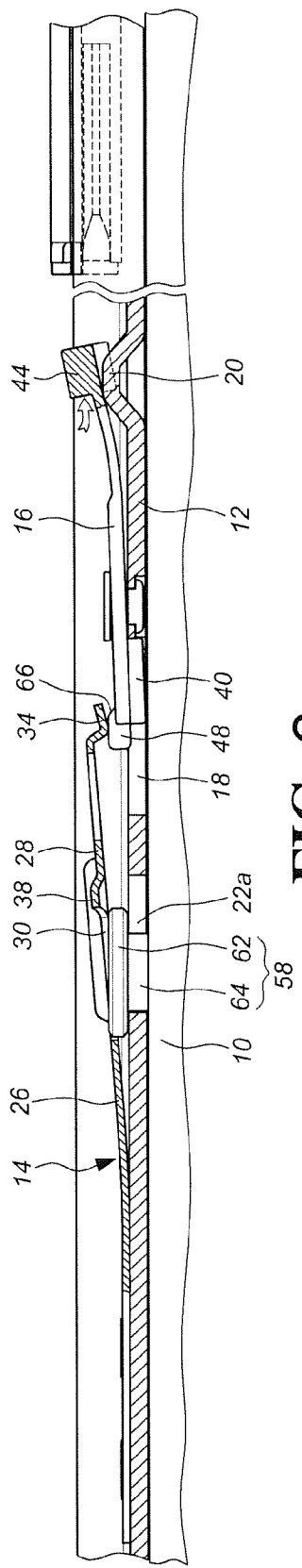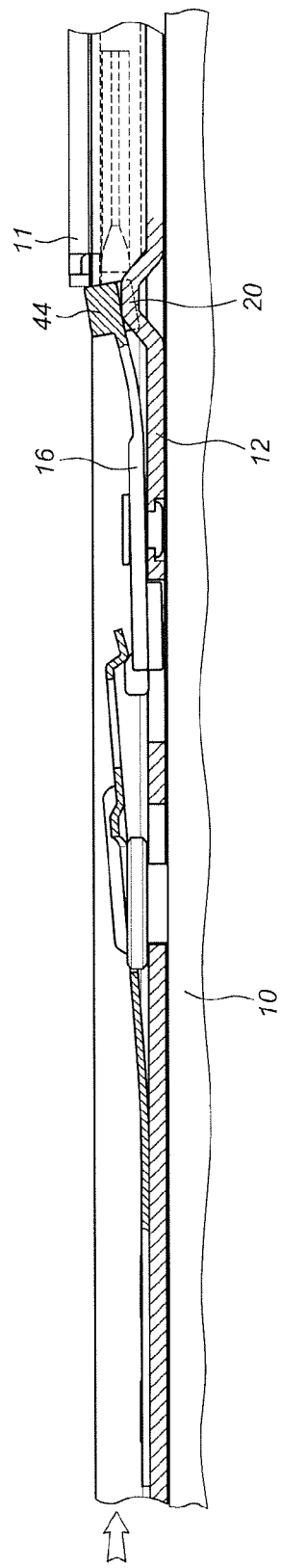

INSTALLATION DEVICE FOR SLIDE ASSEMBLY

FIELD OF THE INVENTION

The present invention relates to an installation device for a slide assembly, and more particularly, to an installation device allowing an exterior equipment to be quickly installed to the slide assembly.

BACKGROUND OF THE INVENTION

The conventional exterior equipment such as a drawer is installed to the slide assembly by fixing two inner rails to the two sides of the drawer by screws, or by setting pins to the metal drawer so as to be connected with holes or plates of the rails. The latest techniques are more convenient to fix these parts and some of the techniques are used to the racks for servers of computers, such as disclosed in U.S. Pat. Nos. 4,331,369, 5,632,542, 6,123,314, 6,209,979 B1, 6,588,866 B2, 6,601,933 B1, 6,938,967 B2, 6,948,691 B2, 7,481,504 B2, 7,604,307 B2 and U.S. Patent Laid-Open Publication No. 2004/0108797 A1.

In the above mentioned prior arts, the resilient plate or swing plate that contacts the protrusions on two sides of the drawer has to be operated by user's finger or by using a tool to shift it. The resilient plate or swing plate has to be maintained its shifted status so that the protrusions of the drawer can be removed from their positions. When the rails are installed to the rack and the drawer is to be removed from the rails, the user has to use one hand to shift the resilient plate or swing plate, and the other hand is used to move the protrusions. This is inconvenient for the users. If the exterior equipment is a server for a computer, the server is heavy so that it is difficult for a user to separate the server from the rails. Usually it requires at least two people to compete the removal of the server.

The applicant owns U.S. Pat. No. 7,661,778 B2 which discloses an inner rail 1, a positioning member 5 and a release member 6, wherein the inner rail has at least two mounting holes 11. The positioning member has one end fixed to the inner rail and the other end has a protruding bit 51 which is located corresponding to the mounting holes. The release member is located in the inside of the inner rail and is movable relative to the positioning member and pushes the positioning member so that the protruding bit is removed in opposite direction from the inner rail. The two protrusions on two sides of the drawer are able to be installed to the inner rails or removed from the inner rails. Furthermore, when the release member is moved and pushes the protruding bit of the positioning member upward, the extension 65b of the release member moves the push block 66b to contact the protrusion member 52b of the positioning member. By this way, the positioning member that is pushed upward is engaged with the middle rail 2b, the middle rail 2b hits the push block of the release member and the moves the release member back to its position via the extension.

Nevertheless, the U.S. Pat. No. 7,661,778 B2 is suitable for the specific the server and the extension between the push block and the release member is an elongate and thin part which may be bent when applied by a force, and the portion that the protruding bit is located is located remote from the inside of the inner rail, so that a larger space is needed. The positioning member may be improperly lifted or deformed by squeezing. Besides, the allocation of the positioning member, the release member and the inner rails does not meet the requirement of the latest servers, so that an improved installation device is needed.

The present invention intends to provide an installation device for a slide assembly and the exterior equipment can be quickly connected to the slide assembly or removed from the slide assembly.

SUMMARY OF THE INVENTION

The present invention relates to an installation device for a slide assembly and comprises a first rail and a second rail slidably connected to the first rail. The second rail has hole, a guide seat, at least one first slot and a second slot. A positioning member has a base, an arm board and an end board. The base is fixed to the second rail and the arm board is connected between the base and the end board. The arm board has a positioning hole located corresponding to the first slot of the second rail. The end board has a through hole and an end piece which extends from an end of the end board and toward the second rail and bends an angle. A release member has a reception portion, a connection board and an operation portion, wherein the reception portion has a recessed reception face and a protrusion extends from the reception face. The connection board is connected between the reception portion and the operation portion. A guide hole is defined between the connection board and the reception portion. A fixing member extends through the guide hole and installs the release member to the second rail. The reception portion of the release member extends into the hole of the second rail. The end board of the positioning member contacts the reception face of the release member and the protrusion of the release member extends through the through hole of the end board. When the operation portion of the release member is moved by an exterior force, the reception portion of the release member will move along the hole of the second rail. The protrusion of the release member contacts the end piece of the end board to push the positioning hole of the arm board to be away from the second rail. The operation portion of the release member resiliently moves and contacts the guide seat of the second rail to position the release member.

Preferably, the positioning hole of the arm board has a top inside and a bottom inside, each of the top and the bottom insides is bent to be a guide wing which extends toward a direction away from the second rail.

Preferably, the arm board contacts the second rail and the positioning hole is located adjacent to the first slot.

Preferably, the positioning hole of the arm board has a contact portion extending from an inside thereof.

Preferably, the release member has two blocks and the second rail has elongate holes with which the blocks are engaged.

Preferably, the protrusion of the release member has an inclined surface which is located corresponding to the end piece of the end board of the positioning member.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 6 shows the releasing action is operated of the slide assembly of the present invention, and FIG. 7 shows that the rail returns by contacting the release member.

DETAILED DESCRIPTION OF THE PREFERRED EMBODIMENT

Figure 1:
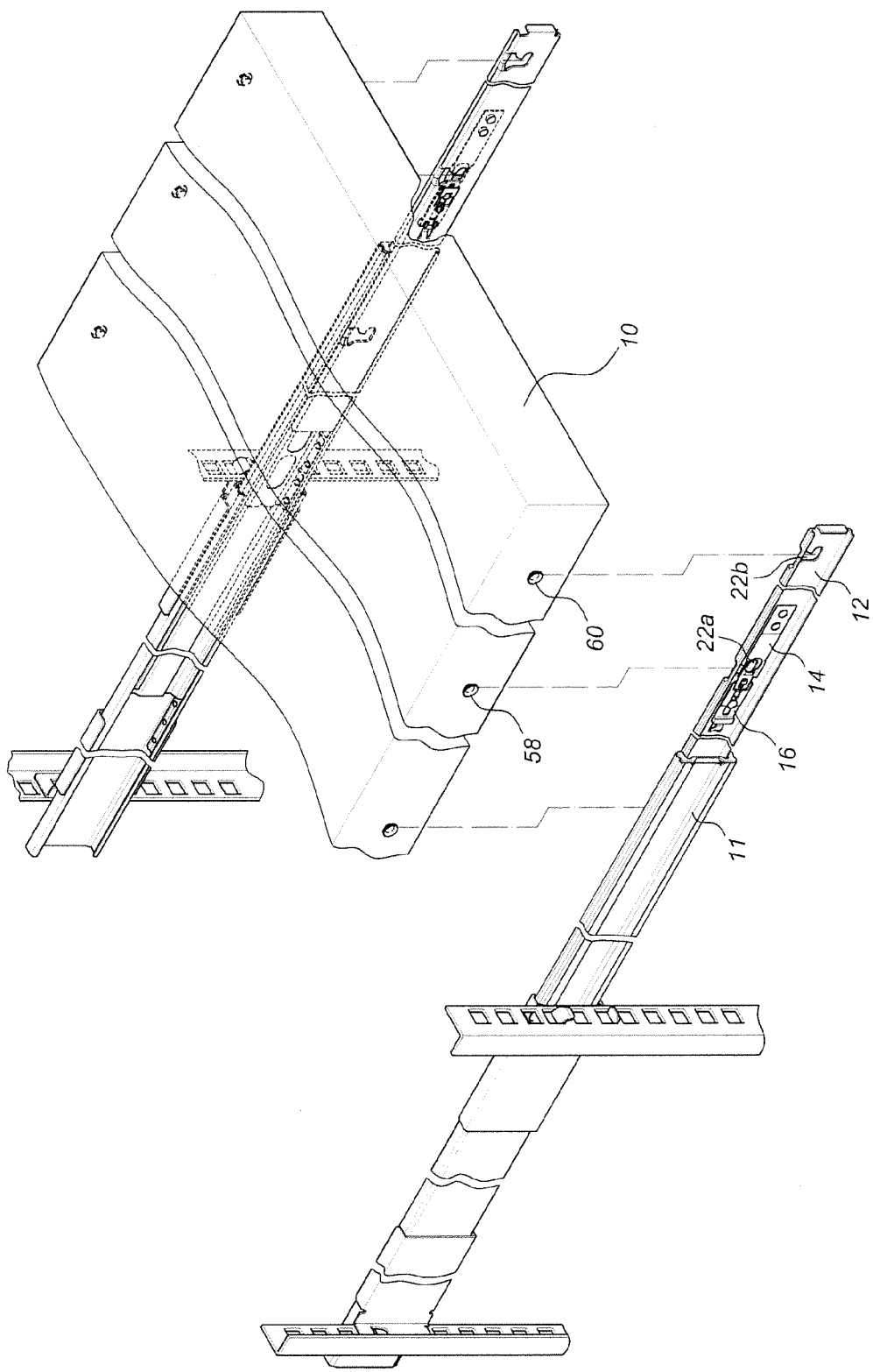
FIG. 1 shows that an exterior equipment is connected to the slide assembly of the present invention on a rack.
Figure 2:
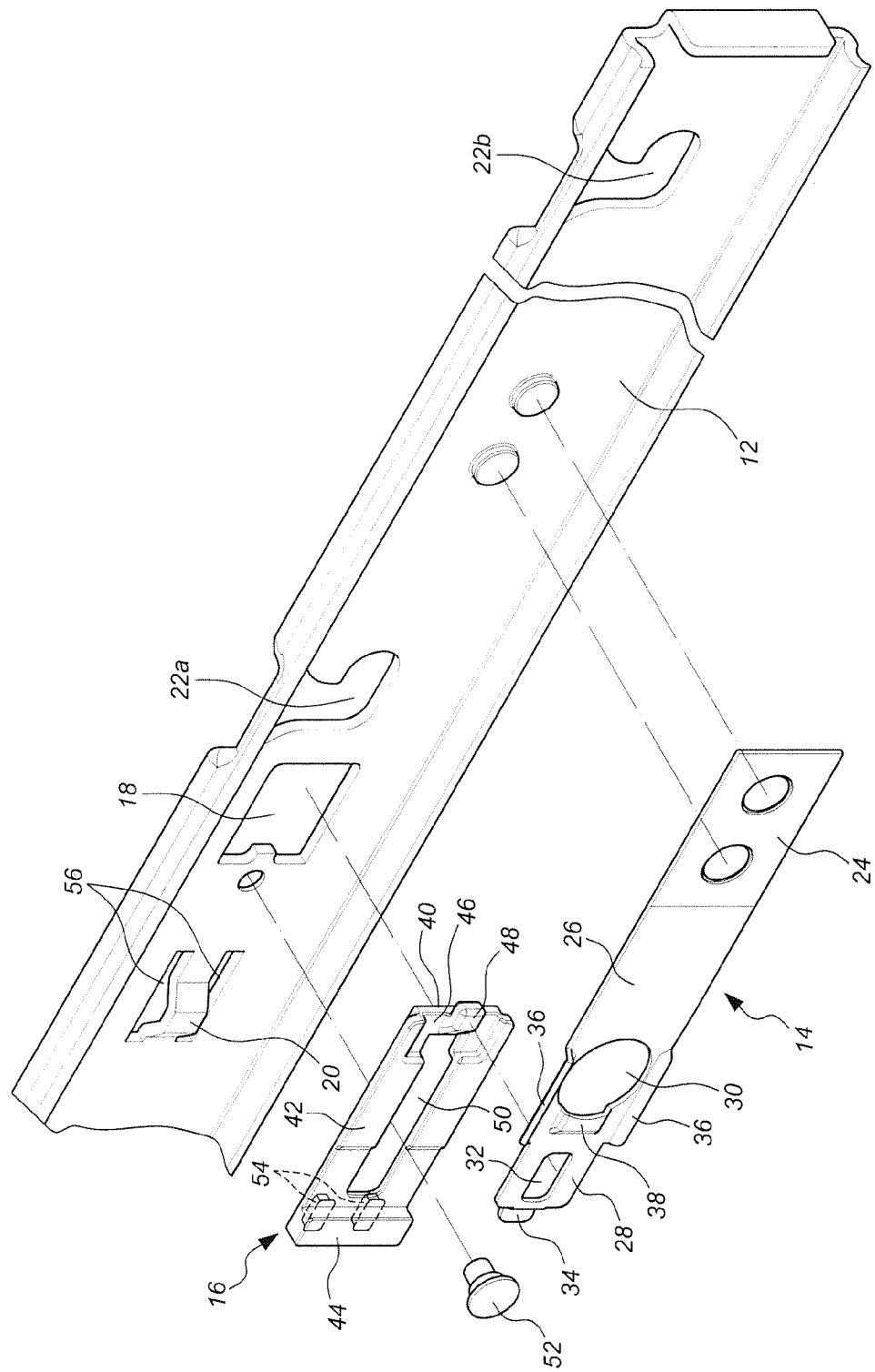
FIG. 2 is an exploded view to show the slide assembly of the present invention.
Figure 3:
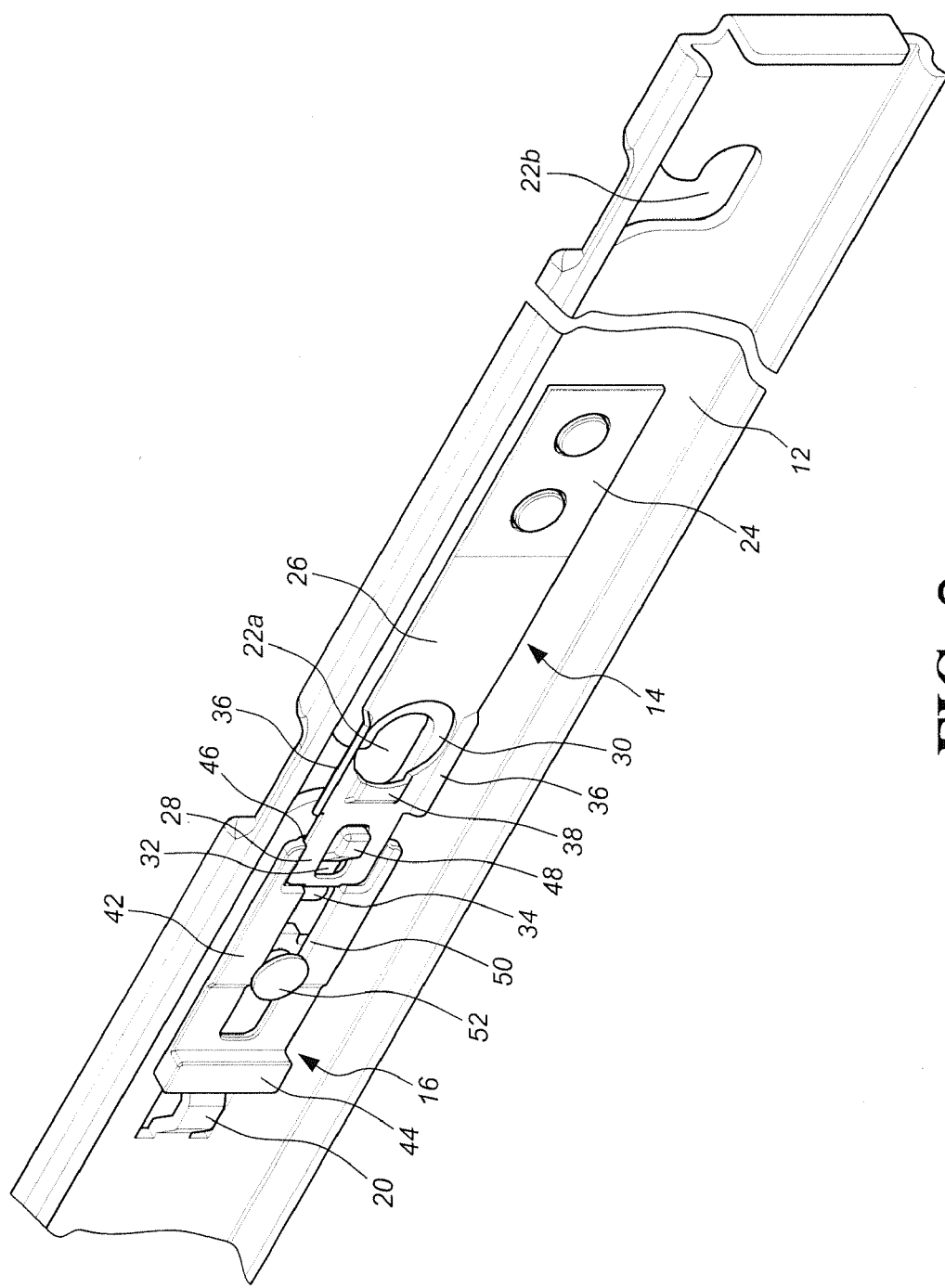
FIG. 3 is a perspective view to show the slide assembly of the present invention.

FIG. 1 shows an exterior equipment 10, such as a server, installed to the slide assembly on a rack system and FIGS. 2 and 3 respectively show the exploded view and the perspective view of the slide assembly of the present invention. The preferable embodiment of the present invention comprises a first rail 11, a second rail 12 slidably connected to the first rail 11, a positioning member 14 and a release member 16.

The second rail 12 has a hole 18, a guide seat 20, and at least one first slot 22a and a second slot 22b, wherein the hole 18 is located adjacent to the first slot 22a.

The positioning member 14 has a base 24, an arm board 26 and an end board 28. The base 24 is fixed to the second rail 12. The arm board 26 is connected between the base 24 and the end board 28. The arm board 26 has a positioning hole 30 located corresponding to the first slot 22a of the second rail 12. Preferably, the arm board 26 contacts the second rail 12 and the positioning hole 30 is located adjacent to the first slot 22a. The end board 28 has a through hole 32 and an end piece 34 which extends from an end of the end board 28 and toward the second rail 12 and bends an angle. Preferably, the positioning hole 30 of the arm board 26 has a top inside and a bottom inside. Each of the top and the bottom insides is bent to be a guide wing 36 which extends toward a direction away from the second rail 12. The positioning hole 30 of the arm board 26 has a contact portion 38 extending from an inside thereof. The contact portion 38 is located adjacent to the end board 28.

The release member 16 has a reception portion 40, a connection board 42 and an operation portion 44. The reception portion 40 has a recessed reception face 46 and a protrusion 48 extends from the reception face 46. The connection board 42 is connected between the reception portion 40 and the operation portion 44. A guide hole 50 is defined between the connection board 42 and the reception portion 40. In one preferable embodiment, a fixing member 52 extends through the guide hole 50 and installs the release member 16 to the second rail 12. The reception portion 40 of the release member 16 extends into the hole 18 of the second rail 12. The release member 16 has two blocks 54 and the second rail 12 has elongate holes 56 with which the blocks 54 are engaged.

When the positioning member 14 and the release member 16 are installed to the second rail 12, the original positions are shown in FIG. 3, The end board 28 of the positioning member 14 contacts the reception face 46 of the release member 16, and the protrusion 48 of the release member 16 extends through the through hole 32 of the end board 28.

Figure 4:
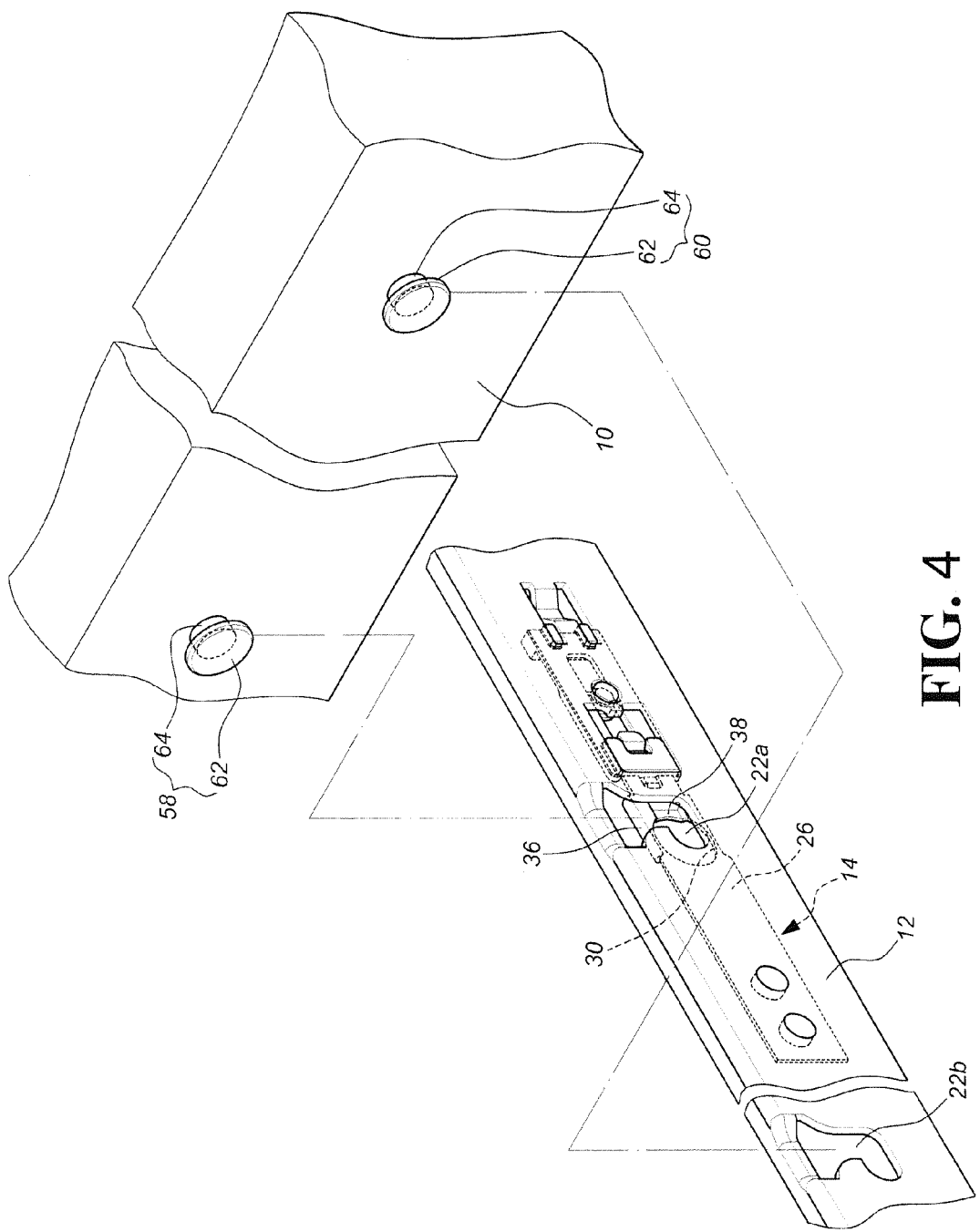
FIG. 4 shows that an exterior equipment is to be connected to the slide assembly of the present invention.
Figure 5:
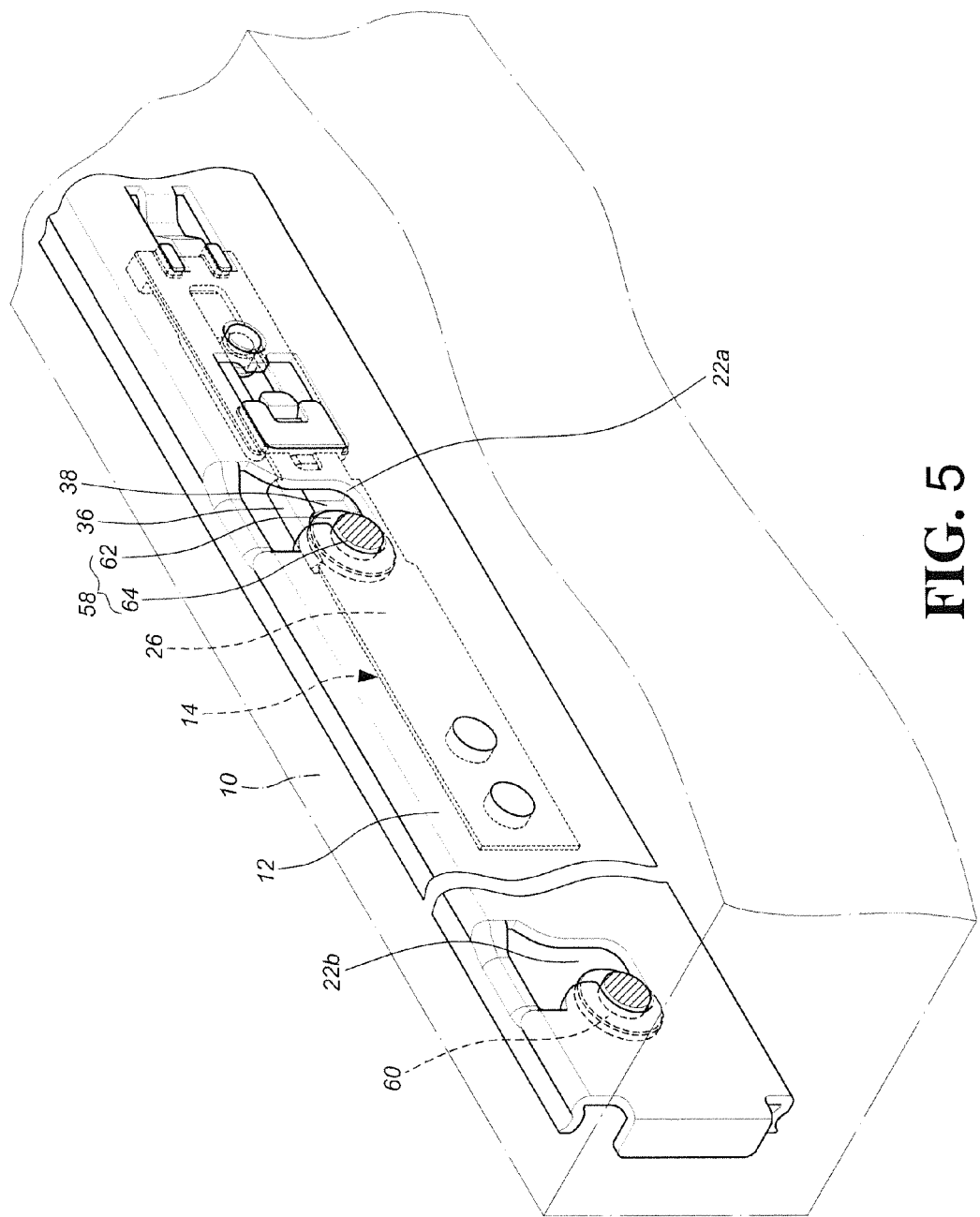
FIG. 5 shows that an exterior equipment is connected to the slide assembly of the present invention.

As shown in FIGS. 1 and 4, the exterior equipment 10 has at least separated first installation member 58 and a second installation member 60 on one side thereof, wherein the first and second installation members 58, 60 are identical and each have a head 62 and a body 64 which extends from the head 62. The diameter of the head 62 is larger than that of the body 64. When the head 62 of the first installation member 58 is engaged with the first slot 22a from top to bottom of the first slot 22a, the guide wing 36 on the top of the positioning hole 30 of the arm board 26 allows the head 62 of the first installation member 58 to contact so as to push the arm board 26 away. As shown in FIG. 5, when the first and second installation members 58, 60 are engaged with the first and second slots 22a, 22b of the second rail 12, the positioning hole 30 of the arm board 26 of the positioning member 14 accommodates the head 62 of the first installation member 58, and the contact portion 38 contacts the head 62. Therefore, the exterior equipment 10 can be installed to the second rail 12 without need of tools.

As shown in FIG. 6, when the operation portion 44 of the release member 16 is moved by an exterior force, the reception portion 40 of the release member 16 moves along the hole 18 of the second rail 12. When the release member 16 moves to a desired position, the protrusion 48 of the release member 16 contacts the end piece 34 of the end board 28 to push the positioning hole 30 of the arm board 26 to be away from the second rail 12. The operation portion 44 of the release member 16 resiliently moves and contacts the guide seat 20 of the second rail 12 to position the release member 16. No extra manual force applied to the positioning member 14 is needed. Therefore, the head 62 of the first installation member 58 can be easily released from the positioning hole 30 of the arm board 26 of the positioning member 14. The first installation member 58 of the exterior equipment 10 can be removed from the first slot 22a of the second rail 12. Preferably, the protrusion 48 of the release member 16 has an inclined surface 66 which is located corresponding to the end piece 34 of the end board 28 of the positioning member 14. The end piece 34 of the end board 28 is easily pushed upward by moving along the inclined surface 66.

FIG. 7 shows that when the exterior equipment 10 is installed to the second rail 12, the operation portion 44 of the release member 16 contacts the guide seat 20 of the second rail 12 and does not return to its original position. Under this status, when the second rail 12 is retracted relative to the first rail 11, the end of the first rail 11 directly contacts the operation portion 44 of the release member 16 to move the release member 16 to its original position.

The present invention is able to release the positioning status between the exterior equipment and the rails and only one person can release and remove the exterior equipment. The arrangement of the present invention occupies less space in the rails and the parts are not deformed easily. The present invention is suitable to be cooperated with slide assemblies with complicated structure.

While we have shown and described the embodiment in accordance with the present invention, it should be clear to those skilled in the art that further embodiments may be made without departing from the scope of the present invention.

What is claimed is:

1. An installation device for a slide assembly, comprising:
a first rail;
a second rail slidably connected to the first rail, the second rail having a hole, a guide seat, and at least one first slot and a second slot;
a positioning member having a base, an arm board and an end board, the base fixed to the second rail, the arm board connected between the base and the end board, the arm board having a positioning hole located corresponding to the first slot of the second rail, the end board having a through hole and an end piece which extends from an end of the end board and toward the second rail and bends an angle;

a release member having a reception portion, a connection board and an operation portion, the reception portion having a recessed reception face and a protrusion extending from the reception face, the connection board connected between the reception portion and the operation portion, a guide hole defined between the connection board and the reception portion, a fixing member extending through the guide hole and installing the release member to the second rail, the reception portion of the release member extending into the hole of the second rail, and the end board of the positioning member contacting the reception face of the release member and the protrusion of the release member extending through the through hole of the end board, when the operation portion of the release member is moved by an exterior force, the reception portion of the release member moves along the hole of the second rail, the protrusion of the release member contacts the end piece of the end board to push the positioning hole of the arm board to be away from the second rail, the operation portion of the release member resiliently moves and contacts the guide seat of the second rail to position the release member.

2. The device as claimed in claim 1, wherein the positioning hole of the arm board has a top inside and a bottom inside, each of the top and the bottom insides is bent to be a guide wing which extends toward a direction away from the second rail.

3. The device as claimed in claim 1, wherein the arm board contacts the second rail and the positioning hole is located adjacent to the first slot.

4. The device as claimed in claim 3, wherein the positioning hole of the arm board has a contact portion extending from an inside thereof.

5. The device as claimed in claim 1, wherein the release member has two blocks and the second rail has elongate holes with which the blocks are engaged.

6. The device as claimed in claim 1, wherein the protrusion of the release member has an inclined surface which is located corresponding to the end piece of the end board of the positioning member.

* * * * *